United States Patent [19]

Naisuler

[11] Patent Number: 4,605,920
[45] Date of Patent: Aug. 12, 1986

[54] PRESCALING DEVICE AND METHOD

[75] Inventor: Alan C. Naisuler, Medford, Mass.

[73] Assignee: Beckman Instruments, Inc., Fullerton, Calif.

[21] Appl. No.: 471,326

[22] Filed: Mar. 2, 1983

[51] Int. Cl.[4] .......................................... H03K 13/20
[52] U.S. Cl. ........................ 340/347 NT; 340/347 AD
[58] Field of Search .................. 340/347 NT, 347 AD

[56] References Cited

U.S. PATENT DOCUMENTS

| | | | |
|---|---|---|---|
| 2,824,297 | 2/1958 | Josias et al. | 340/253 |
| 2,994,825 | 8/1961 | Anderson | 328/129 |
| 3,187,323 | 6/1965 | Flood et al. | 340/347 |
| 3,368,149 | 2/1968 | Wasserman | 324/99 |
| 3,399,349 | 8/1968 | Davis | 324/115 |
| 3,414,807 | 12/1968 | Evans | 324/111 |
| 3,414,898 | 12/1968 | Barton | 340/347 |
| 3,439,271 | 4/1969 | Metcalf | 324/99 |
| 3,439,272 | 4/1969 | Bailey et al. | 324/111 |
| 3,500,384 | 3/1970 | Naydan et al. | 340/347 |
| 3,525,093 | 8/1970 | Marshall | 340/347 |
| 3,541,446 | 11/1970 | Prozeller | 324/99 |
| 3,555,298 | 1/1971 | Neelands | 307/235 |
| 3,566,397 | 2/1971 | Walton | 340/347 |
| 3,577,194 | 5/1971 | Beall | 340/347 AD |
| 3,585,634 | 6/1971 | Sharples | 340/347 |
| 3,617,885 | 11/1971 | Wheable | 324/99 D |
| 3,623,073 | 11/1971 | Wheable et al. | 340/347 NT |
| 3,634,852 | 1/1972 | Bayati | 340/347 NT |
| 3,662,376 | 5/1972 | Furukawa et al. | 340/347 AD |
| 3,665,457 | 5/1972 | Wheable | 340/347 NT |
| 3,703,001 | 11/1972 | Hibbs, Jr. | 340/347 NT |
| 3,728,625 | 4/1973 | Senour et al. | 324/99 D |
| 3,733,600 | 5/1973 | Hellwarth et al. | 340/347 NT |
| 3,772,683 | 11/1973 | Dorey | 340/347 NT |
| 3,774,018 | 11/1973 | Spreitzhofer | 235/183 |
| 3,790,886 | 2/1974 | Kurtin et al. | 324/99 D |
| 3,826,983 | 7/1974 | Garratt et al. | 324/99 D |
| 3,829,852 | 8/1974 | Nilsson et al. | 340/347 NT |
| 3,893,105 | 7/1975 | Wasserman | 340/347 NT |
| 3,895,376 | 7/1975 | Uchida | 340/347 NT |
| 3,965,467 | 6/1976 | Monger | 340/347 NT |
| 3,967,270 | 6/1976 | Anderson, Jr. et al. | 340/347 NT |
| 3,999,123 | 12/1976 | Thoener | 324/99 D |
| 4,013,955 | 3/1977 | Wagner | 324/72 |
| 4,178,585 | 12/1979 | Takagi et al. | 340/374 NT |
| 4,404,545 | 9/1983 | Nakanishi et al. | 340/347 NT |

Primary Examiner—B. Dobeck
Attorney, Agent, or Firm—W. H. May; G. T. Hampson; S. R. Markl

[57] ABSTRACT

A prescaling device and method including a timer for generating a timing signal at the end of each of a plurality of timing periods and an integrator for integrating an input signal to generate an integrator output signal proportional thereto. The integrator can hold the integrator output signal in response to hold signal. A comparator is responsive to the integrator output signal for generating a signal when the integrator output exceeds a predetermined level. Control logic generates the hold signal in response to the comparator signal and the timing signal whereby integration is halted at the end of one of the timing periods. A counter counts the timing signals to thereby determine the number of timing periods elapsing prior to the halt of integration. The number of timing periods is indicative of an integration timing range which in turn is indicative of a scaling factor which may be applied to the held output of the integrator. In a preferred embodiment, the timing signals define timing ranges such that each timing range is twice as long as the immediately preceding timing range, whereby the scaling factor decreases by a multiple of two at the end of each timing range.

25 Claims, 3 Drawing Figures

PRESCALING DEVICE AND METHOD

BACKGROUND OF THE INVENTION

1. Field of the Invention

The present invention relates generally to prescaling devices and methods and more particularly to a prescaling device and method useful for scaling an analog signal for use by an analog-to-digital converter. The invention is particularly suited for use in applications, such as spectrometry, in which the magnitude of an input analog signal varies over a relatively wide range and where automatic prescaling is desirable.

2. Description of the Prior Art

Analog-to-digital conversion techniques are widely used to provide an interface between an analog signal generator and a digital signal receiver or processor, such as a digital computer. Numerous analog-to-digital converters are known in the art, including dual slope converters and successive approximation converters.

Generally, an analog-to-digital converter (ADC) is adapted to receive an input analog signal within a fixed range. The ADC generates a plurality of output binary digits (bits), the value of which provides a binary representation of the input analog signal magnitude. The magnitude of the fixed range and the number of digits generated by the ADC determine the resolution for the ADC, that is, the increment or amount of analog signal represented by the least significant digit or bit of the ADC digital output. For example, the resolution of an ADC having a zero-to-ten volt input analog range and an eight digit or bit output is approximately 39 millivolts.

Because ADCs are generally adapted to operate within a fixed analog range, it is known to prescale or controllably attenuate or amplify the input analog signal and to apply the resulting prescaled signal to the ADC. Where the input analog signal is greater than the ADC range, prescaling prevents the ADC from operating in an overrange condition. Such a condition leads to the loss of data in the system and could damage the ADC if the input analog signal level is sufficiently high.

Also, where the input analog signal is less than the ADC fixed range, prescaling of the signal can increase the signal magnitude to correspond to a larger portion of the ADC range. Because the resolution of the ADC is generally fixed, such prescaling helps to improve the accuracy or precision of the resulting ADC digital output.

Various prescaling or ranging devices are known in the art. For example, prescaling may be done by using a plurality of attenuating resistors as shown in U.S. Pat. No. 3,399,349 to Davis or may be accomplished by varying the gain of an input amplifier stage as shown in U.S. Pat. Nos. 4,013,955 and 3,566,397 to Wagner and Walton, respectively. However, the precision resistive networks or networks which vary the gain of the amplifier require precision components which increase the cost and complexity of the device. Moreover, where switches are opened or closed to select the proper range, it may be necessary to allow a period of time to pass so that the device can stabilize after transients are introduced as a result of the switching process. Any such delay undesirably slows the prescaling process and thus the time for a complete measurement cycle.

The magnitude of prescaling required can be manually or automatically selected. Manual selection, however, is relatively slow and can result in inaccurate data.

With respect to automatic prescaling, several such devices are illustrated in U.S. Pat. Nos. 3,703,001 to Hibbs, Jr.; 3,790,886 to Kurtin et al.; and 3,187,323 to Flood et al. However, such automatic prescaling devices generally require that an analog-to-digital measurement cycle be completed before an out-of-range condition is detected. Thus, one or more measurement cycles can be wasted before the proper magnitude of prescaling is selected. The wasted measurement cycles present a significant drawback particularly where the measurements are used in an automated system because data can be lost while selecting the required prescaling.

Where the input analog signal is relatively small, it is known to integrate the input signal over a plurality of predetermined time intervals. One such system is disclosed in U.S. Pat. No. 3,525,093 to Marshall. At the end of each interval, an integrator which integrates the input signal is reset toward zero. A value stored by a counter is varied according to the amount that the integrator was reset. Such a system can be considered as a form of an analog-to-digital converter.

A system as disclosed in Marshall, however, suffers from several difficulties. For example, it is relatively slow since it requires a number of time periods in order to accumulate a meaningful result. Moreover, the system may not provide accurate results because the integrator may have a significant charge left at the end of the last predetermined interval. Also, the range of the input signal is limited by the time interval selected and the maximum amount that the integrator can be reset at the end of a time interval.

Thus, there is a need for a prescaling device and method which is adapted to operate automatically but which does not waste measurement time in determining the proper amount of prescaling required. There is also a need for a prescaling device and method which operates relatively quickly and precisely yet which can accommodate a wide range of input signal levels.

SUMMARY OF THE INVENTION

The present invention resides at least in part in a prescaling device and method which overcomes the limitations and drawbacks of the prior art. The invention can automatically find the correct prescaling range without requiring a complete measurement or conversion cycle to be performed. The invention is capable of operating over a relatively large input analog signal range yet does not require the precision components often used in the prior art as described above. Moreover, the present invention provides relatively accurate and precise prescaling of an analog signal yet is relatively simple and inexpensive to implement.

Generally, a device in accordance with the present invention integrates an input signal during one of a plurality of integration timing ranges. The duration of the integration timing range provides an indication of a scaling factor that may be applied to the integrated result.

To the foregoing ends, the present invention resides in a device and a method performed by the device wherein the device includes a timer which generates a timing signal at the end of each of a plurality of timing periods. An integrator integrates an input analog signal and generates an integrator output proportional to the integrated signal. The integrator is adapted to hold the integrator output in response to a hold signal. A comparator compares the integrator output during integration to a reference signal level and provides an output when the integrator output exceeds the reference level. Gating circuitry generates the hold signal in response to the comparator output and a timing signal at the end of one of the timing periods. A counter or other suitable means responsive to the timing signal counts the number of timing signals before the integrator output was held to establish an integration timing range providing an indication of a scaling factor which may be applied to the held integrator output.

In a preferred embodiment as disclosed herein, the reference signal level applied to the comparator is not greater than a predetermined signal level which defines a signal range level equal to substantially one-half the signal range of the integrator output. Moreover, each timing signal defines a timing range comprising the sum of the previous timing periods and the timer includes suitable means for establishing the duration of the timing periods such that each timing range is twice as long as the immediately preceding timing range. In response to the hold signal, a conventional ADC responsive to the held integrator output can provide a digital output which may be scaled or multiplied in accordance with the count determined by the counter to provide a resulting digital representation. The integrator further may include a switching device which operates solid-state switches in a reciprocal fashion to minimize charge injection into the integrator input terminal.

DESCRIPTION OF THE PREFERRED EMBODIMENT

An overall description of the present invention is first set forth with reference to FIGS. 1 and 2. The detailed circuitry of FIG. 3 is then described to provide an example of conventional circuit elements which can together implement the embodiment generally described for FIGS. 1 and 2.

Figure 1:
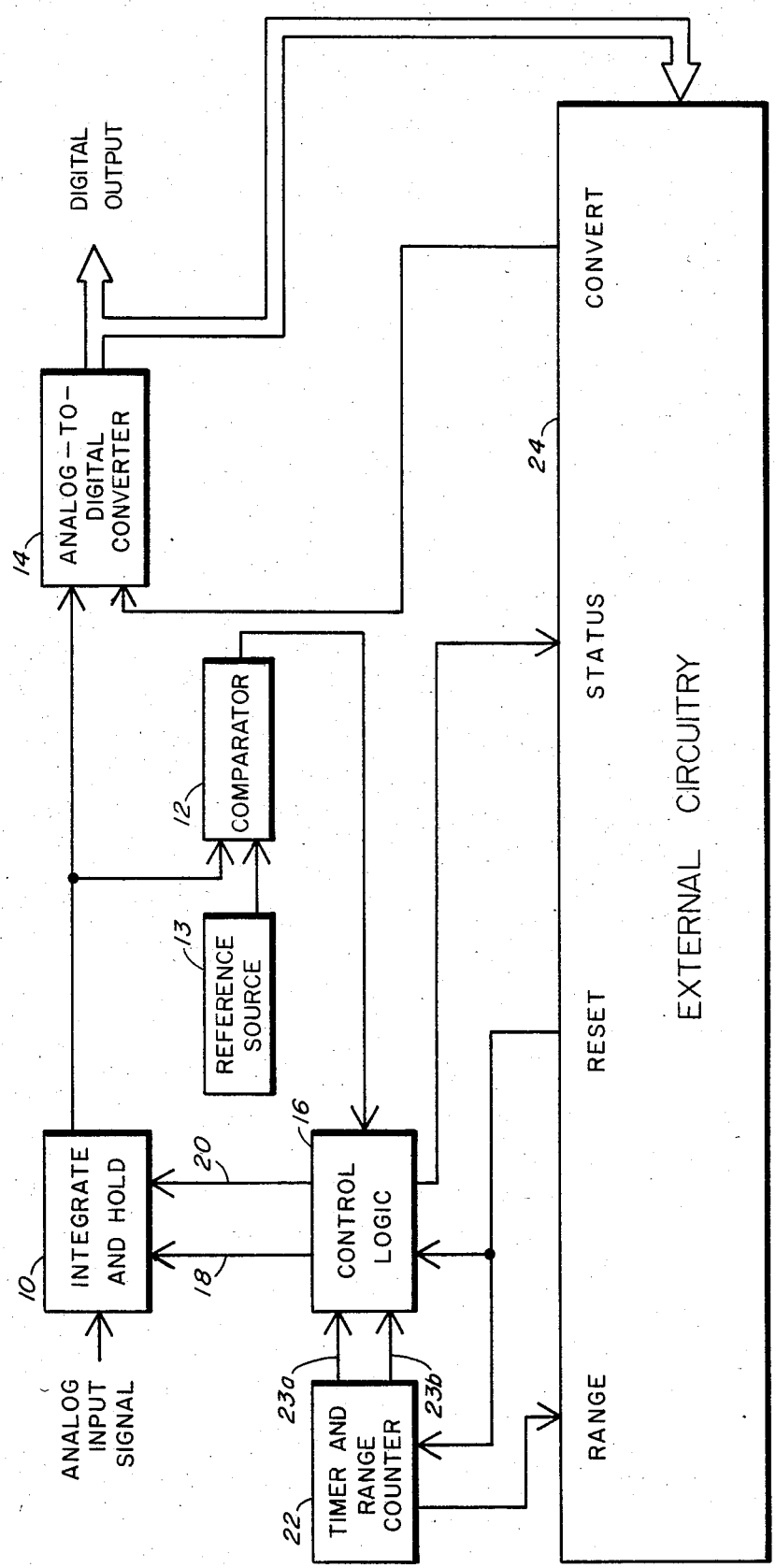
FIG. 1 is a functional block diagram of a prescaling device in accordance with the present invention, the prescaling device scaling the input to an analog-to-digital converter.

As seen with respect to FIG. 1, an analog input signal is applied to an integrate and hold circuit 10. The analog input signal may be generated by, for example, a detector such as a photomultiplier tube in a spectrometer.

The output from the integrate and hold circuit is applied to one input of a comparator 12. A reference source 13 generates a reference signal at a predetermined signal level which is applied to a second input of the comparator 12. The output of the integrate and hold circuit 10 is also applied to an analog-to-digital converter 14 which may be of conventional design.

The comparator 12 compares the output from the integrate and hold circuit 10 with the reference signal predetermined level. When the output from the integrate and hold circuit 10 is greater than the predetermined level, the comparator 12 generates an output that is applied to control logic 16.

The control logic 16 includes gating means which generates an integrate/hold signal applied via line 18 to the integrate and hold circuit 10. Such signal controls the integrate and hold circuit 10 to either integrate the analog input signal or to hold the integrated result. The control logic 16 also generates a reset signal applied on a line 20 to the integrate and hold circuit 10 which causes the circuit 10 to reset integrator means therein. Moreover, the control logic 16 generates a status signal that is applied to external circuitry 24. As is described more fully with reference to FIG. 3, the external circuitry can include a microprocessor system of conventional design.

The timer and range counter 22 includes timer means for generating timing signal pulses applied via a line 23a to the control logic 16. The timing signal pulses define successive timing periods having predetermined durations. First counting means within the timer and range counter 22 counts the timing signal pulses, and thus the number of timing periods, which occur during the time that the integrate and hold circuit 10 integrates the input signal. The timer and range counter 22 generates a range signal applied to the external circuitry 24 related to the number of timing periods counted during the time integration took place, thereby indicating an integration timing range. As is described more fully below, the integration timing range defines a scaling factor by which the output of the integrate and hold circuit 10 may be scaled by the external circuitry 24. Second counting means within the timer and range counter 22 counts a predetermined number of pulses and generates a last range signal applied via a line 23b to the control logic 16.

The external circuitry 24, in response to the status signal, can generate a convert command which is applied to the analog-to-digital converter 14, causing the converter 14 to generate its digital output in proportion to the signal from the integrate and hold circuit 10. A reset command may be applied to the timer and range counter 22 and to the control logic 16 from the external circuitry 24. The reset command resets the first and second counting means within the timer and range counter 22 so that a next prescaling operation may be started. The reset command also causes the control logic 16 to generate the reset signal on the line 20.

Figure 2:
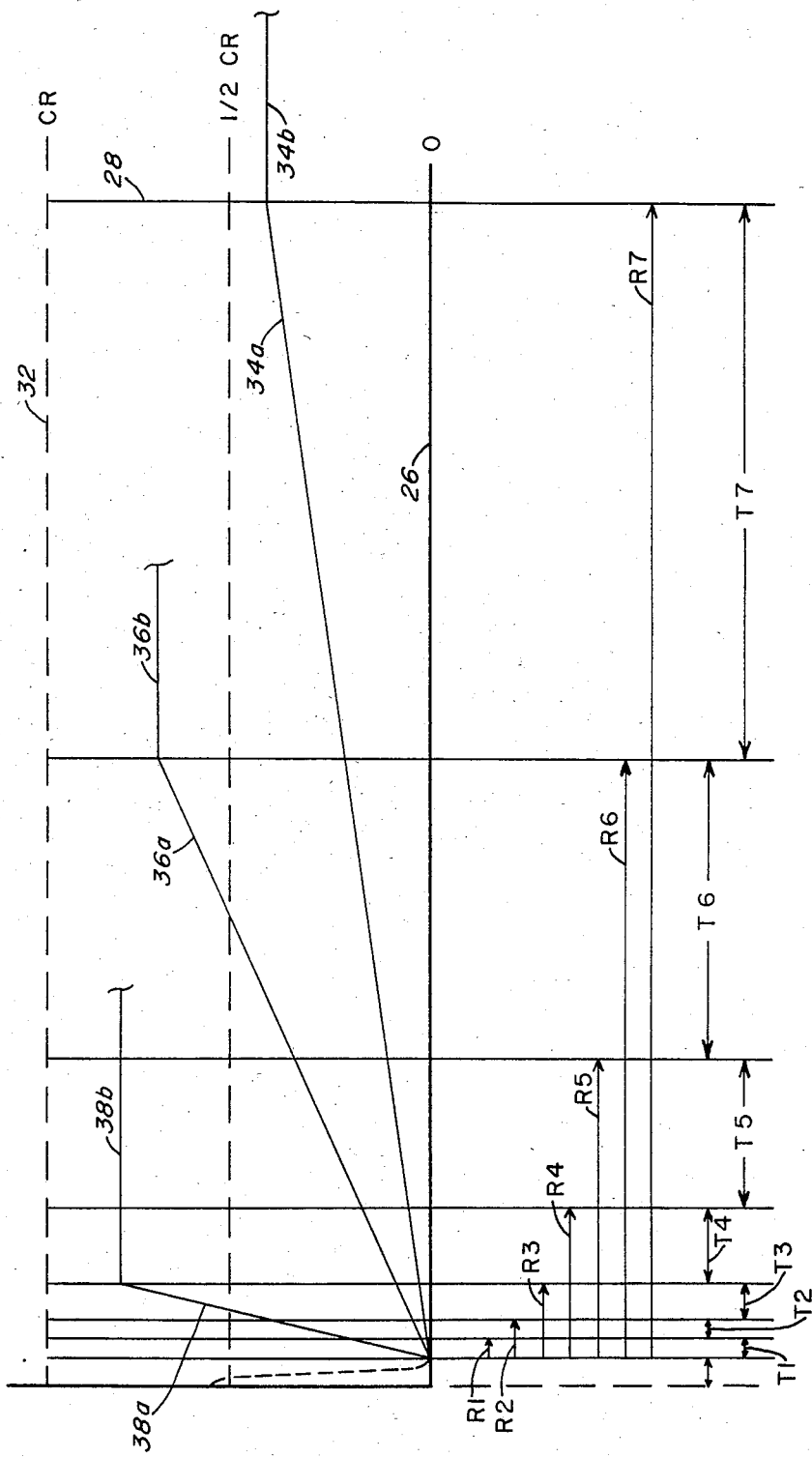
FIG. 2 is a timing graph useful for illustrating the operation of the prescaling device as shown in FIG. 1.
Figure 3:
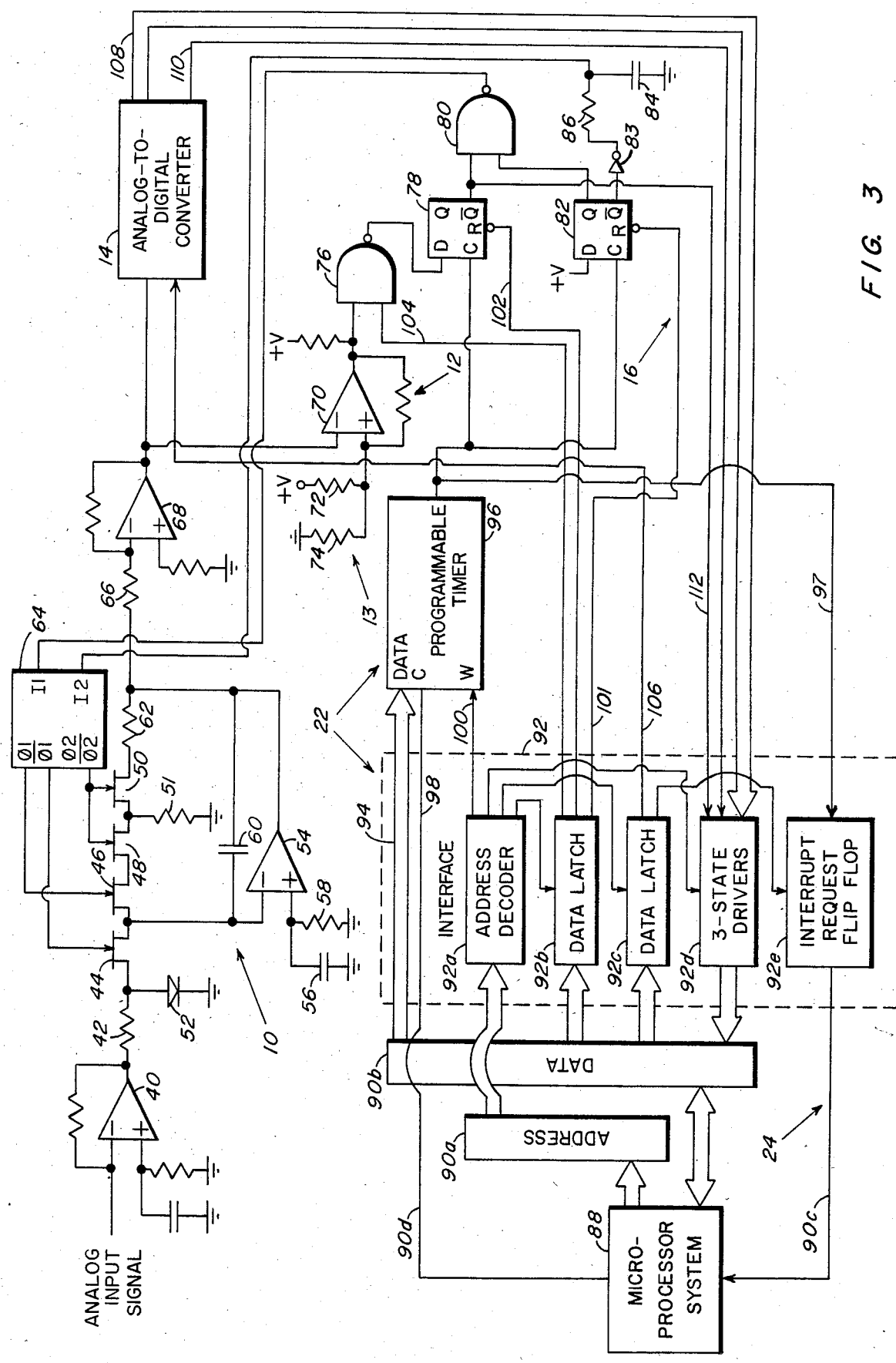
FIG. 3 is a simplified schematic drawing of a preferred embodiment of an analog-to-digital conversion system employing the prescaling device of FIG. 1.

Several signal level and timing relationships used in the operation of the prescaling device can best be understood with reference to FIG. 2. An abscissa 26 in FIG. 2 represents time while an ordinate 28 thereof represents the output signal from the integrate and hold circuit 10. In the embodiment of FIG. 1, the range of the output signal from the integrate and hold circuit 10 is defined by a first signal level when the circuit 10 is reset and a second signal level equal to the maximum output signal from the circuit 10. Preferably, such signal range corresponds to the analog input range of the converter 14 with the first level defined by the abscissa 26 and the second level equal to the upper limit of the converter range (CR) shown by a dashed line 32. The range can be, for example, from zero volts at the abscissa 26 to ten volts at the dashed line 32.

A dashed line 30 represents a predetermined signal level which defines a second signal range between the first level of the circuit 10 output and the predetermined signal level. The predetermined signal level is fixed midway between the abscissa 26 and the maximum output from the circuit 10 shown by the dashed line 32, or five volts. In the embodiment of FIG. 10, the referenced source 13 generates the reference signal at a level equal to the predetermined signal level shown by the dashed line 30. Thus, the circuit 10 output signal range is two times the signal range established by the predetermined signal level and the reference signal.

With continued reference to FIGS. 1 and 2, the timing signal pulses generated by the timer means within the timer and range counter 22 define a plurality of timing periods T1-T7. Each timing period T1-T7 begins and ends with a timing signal pulse. Thus, the timing signal pulse that ends timing period T1 begins timing period T2, and so on. The timing periods T1-T7 together in turn establish a plurality of timing ranges R1-R7, each of which begins at the start of timing period T1. Moreover, the ranges R1-R7 end concurrently with the ends of timing periods T1-T7, respectively. Consequently, the ranges R1-R7 are equal in duration to the lengths of the timing periods which make up the ranges. As examples, range R1 is equal in duration to the length of timing period T1 which makes up range R1, and range R3 is equal in duration to the length of timing periods T1, T2 and T3 which together make up range R3. The ranges R1-R7 define a plurality of integration timing ranges during which the integrate and hold circuit 10 is allowed to integrate or accumulate the analog input signal applied thereto.

Each of the ranges R2-R7 is twice as long as the immediately preceding range, R1-R6. For example, range R7 is twice as long as range R6 and R6 is twice as long as range R5. Thus it is seen that the ratio established between the circuit 10 output signal range to the signal range established between the first level of the circuit 10 output and the predetermined signal level is equal to the ratio of the length of a timing range to the length of an immediately preceding timing range. As just described, the ratio of such signal ranges is two, which is equal to the ratios of the lengths of ranges R2-R7 to the lengths of the immediately preceding ranges R1-R6.

As will be shown by several examples which follow, the operation of the prescaling device of FIG. 1 includes integrating the analog input signal for a period of time equal to one of the timing ranges R1-R7 and holding the resulting output from the integrate and hold circuit 10. The timing range that equals the time of integration is referred to herein as the integration timing range. One of the timing ranges is selected as a calibration range. Here, the longest range R7 is such calibration range. Because the integration timing range may be any one of the ranges R1-R7, the held output from the circuit 10 is scaled or adjusted to a value which would have been obtained had integration been performed during the calibration range. A scaling factor by which such held output is scaled is equal to the ratio of the calibration range to the integration timing range required to develop the particular held output. Advantageously, the scaling factor is determined at the end of the integration timing range, thereby eliminating the necessity of a complete measurement cycle to perform the prescaling function as is disclosed in the prior art.

As a first example of the operation of the device of FIG. 1, the external circuitry 24 begins such operation by generating the reset command that is applied to the timer and range counter 22 and the control logic 16. In response to the reset command, the first and second counting means are reset and the timer means generates a timing signal pulse which begins a reset or clear period designated C in FIG. 2. The control logic 16 generates the reset signal on the line 20 which controls the integrate and hold circuit 10 to reset or clear the integrator means therein. In the present embodiment, the integrate and hold circuit 10 output is cleared to a zero volt level as shown by the dashed line 25. At the end of the clear period C, the timer and range counter 22 generates another timing signal pulse. In response thereto, the control logic 16 removes the reset signal from the circuit 10 and generates the integrate/hold signal on the line 18 so that the clear period C ends and the first timing period T1 begins with the circuit 10 integrating the analog input signal applied thereto.

Assume that the analog input signal produces an output from the integrate and hold circuit 10 as shown by the line designated 34a in FIG. 2 throughout an integration timing range defined by the range R7. If such output remains below the predetermined level 30, the comparator 12 does not generate an output signal. However, during time period T6, the second counting means generates the last range signal that is applied to the control logic 16. The gating means within the control logic 16, in response to the last range signal and the timing signal pulse at the end of timing period T7 and range R7, applies a hold signal via the line 18 to the integrate and hold circuit 10, thereby controlling the circuit 10 to hold the integrated output. Such held output is shown in FIG. 2 at 34b. The control logic 16 also generates the status signal showing that the integration has terminated and the timer and range counter 22 generates the range signal indicating that timing periods T1-T7 were counted and thus that the integration was terminated at the end of range R7.

Because integration continued until the end of range R7, range R7 is the integration timing range. In the embodiment illustrated in FIGS. 1 and 2, range R7 is also the calibration range. The scaling factor to be applied to the held output 34b is the ratio of the calibration range to the integration timing range and is therefore unity (1) for the present example. This is to say that the analog input signal generated a held output 34b which requires no scaling factor to be applied thereto.

As seen in FIG. 1, the output of the integrate and hold circuit 10 is applied to the converter 14. The external circuitry 24, in response to the status signal from the control logic 16, commands the analog-to-digital converter 14 to convert the held output 34b from the integrate and hold circuit 10 to thereby produce the corresponding digital output. Because no scaling factor needs to be applied in the present example to the output of the integrate and hold circuit 10, the external circuitry 24 may use the digital output from the converter 14 without further processing.

Once the digital output has been read by the external circuitry 24, the reset command is generated and the prescaling device is reset as previously described. At the end of the reset or clear period C, the timer and range counter 22 generates the timing signal pulse which defines the beginning of timing period T1 and the beginning of all of the timing ranges R1-R7.

Assume now as a second example that the analog input signal has a magnitude greater than that encountered in the first example and that the integrate and hold circuit output rises as shown by a line or curve 36a in FIG. 2. It is seen that the integrate and hold output 36a rises above the predetermined level 30 during the timing period T6. When the output 36a is greater than the predetermined level 30, the comparator 12 generates an output that is applied to the control logic 16.

As described previously, the timer means within the timer and range counter 22 generates timing signal pulses at the end of each timing period. When the control logic 16 receives the timing signal pulse at the end of period T6 in the presence of the output from the comparator 12, the control logic 16 generates the hold signal via the line 18. The hold signal controls the integrate and hold circuit 10 to hold the integrated output. Thus, once the integrate and hold circuit output 36a rises above the predetermined level 30, the integration is terminated and the output from the integrate and hold circuit 10 is held upon receipt by the control logic 16 of the next timing signal from the timer and range counter 22. The held output from the integrate and hold circuit 10 is indicated in FIG. 2 at 36b.

At the time the integrate and hold circuit 10 output is held, the control logic 16 generates the status signal and the first counter means within timer and range counter 22 generates the range signal indicating that timing periods T1-T6 occurred and that the integration was terminated at the end of range R6.

As noted previously, the ratio of the calibration range to the integration timing range defines the scaling factor that is to be applied to the output of the integrate and hold circuit 10. In the first example described above, the integration continued until the end of the longest range, R7, and no scaling factor (i.e., a scaling factor of unity) was applied to the result from the converter 14. However, in the second example now under consideration, the integration stopped at the end of range R6, establishing R6 as the integration timing range. As also previously described, range R7 is twice as long as range R6. Consequently, the scaling factor is two. The scaling factor may be confirmed by a consideration of the result obtained had integration continued through range R7. In such an instance and assuming that the input analog signal average magnitude integrated during range R6 remained constant throughout range R7, the resulting held output from the integrate and hold circuit 10 would have been substantially twice the level of the signal at 36b. Thus, by scaling or multiplying the signal level 36b at the end of range R6 by a factor of two (2), the resulting signal level is equivalent to a signal level which would have been generated had integration been performed throughout range R7. Moreover, the held output 36b is well within the range of the converter 14. Had integration in this second example continued throughout range R7, the resulting held output at the end of range R7 would have been outside the converter 14 range.

In the embodiment of FIG. 1, the held output is first converted to the digital output by the converter 14 and the scaling factor is then applied thereto by the external circuitry. In the present example and in response to the status signal, the external circuitry 24 generates a convert command which is applied to the analog-to-digital converter 14, causing the converter 14 to convert the held integrated output signal from the integrate and hold circuit 10 into the digital output. The digital output, which is a digital representation of the held output signal from the integrate and hold circuit 10, is multiplied or scaled by two by the external circuitry 24 according to the integration timing range indicated by the range signal from the timer and range counter 22.

In yet a third example with reference to FIG. 2, and with the integrate and hold circuit 10 reset during the reset or clear period C, assume that the analog input signal generates an integrated output signal from the integrate and hold circuit 10 corresponding to a curve 38a. It is seen that the integrated signal 38a rises above the predetermined level 30 during the timing period T3. Consequently, the control logic 16 functions as previously described to terminate the integration and to hold the resulting integrated output signal at the end of the range R3 as shown by the integrated signal level 38b (FIG. 2).

It is to be noted that range R7 is 16 times longer than the range R3. Thus, the ratio of range R7 to range R3 determines a scaling factor of sixteen. Stated in another way, range R3 is followed by four ranges, R4-R7, each of which is twice as long as the immediately preceding range. Thus, range R4 is twice as long as range R3, range R5 is twice as long as range R4, and so on. The resulting multiplier or scaling factor is two multiplied by itself four times, that is $2^4$ or sixteen.

As with the first two examples, the external circuitry 24 commands the converter 14 to convert the held output to a digital output. In accordance with the range signal from the timer and range counter 22 indicating that the integration stopped at the end of range R3, the external circuitry 24 multiplies or scales the digital output from the converter 14 by a factor of sixteen.

Similar results are achieved in the other ranges. For example, should integration terminate at the end of range R1, a scaling factor or multiplier of 64 is applied to the digital output which represents the magnitude of the held signal from the integrate and hold circuit 10. Importantly, when integration stops at the end of any one of the ranges R1-R7, the external circuitry 24 may then immediately command the converter 14 to convert the held integrator output. Such a feature eliminates the need of completing an entire measurement cycle as generally described in the prior art. Moreover, the prescaling device of FIG. 1 provides a relatively wide dynamic range of operation. For example, in the embodiment disclosed herein, the analog input signal may have a range of 10 microvolts to 10 volts.

As described previously, the ratio of the range of the output signal from the circuit 10 between first and second levels to the portion of such range established between the first level and the predetermined level equals the ratio of times between a timing range with respect to its immediately preceding timing range. For example, the present embodiment employs a ratio of two between the circuit 10 output signal range and the second signal range defined by the predetermined level. Also, the ratio of a timing range to its immediately preceding timing range is two, as, for example, the ratio between the ranges R7 and R6. Both such ratios are further equal to the multiplier or scaling factor between successive ranges. Here, for example, the scaling factor applied to integration results ending in range R6 is two times the results obtained when integration ends at the end of range R7.

However, such ratios may be varied from those disclosed herein and the sequence of determining such ratios is not crucial. As an example, one may first select a sealing factor or multiplier of three between each timing range and the respective immediately preceding timing range. In such an instance, each time range would be three times longer than the respective immediately preceding timing range and the ratio between the range of the integrated output to the range established by the predetermined level would then also equal three. Applying these parameters to the embodiment disclosed herein, the predetermined level would be one-third the integration output range from the integrate and hold circuit 10, or about 3.33 volts, and the time ranges R2–R7 would each be three times longer than the immediately preceding ranges R1–R6. Morever, the scaling factors for several timing ranges compared to the calibration range R7 would be 3 for R6, 9 for R5, and so on. Thus, the determination of one relationship, such as scaling factor, determines the remaining relationships, namely the ratios between timing ranges and signal ranges. Moreover, any range R1–R7 can be selected as the calibration range. The resulting ratios properly establish the scaling factors required. In the present embodiment, range R7 was selected as the calibration range and the scaling factors related to two were selected because the multiplications required to apply the scaling factors to the digital output of the converter 14 are easily performed by a microprocessor system. Other variations in accordance herewith will be apparent to those skilled in the art.

The preceding examples set forth with respect to FIG. 1, and the examples that follow described with reference to FIG. 3, assume that the reference source generates a reference signal at a level equal to the predetermined signal level 30 of FIG. 2. It is to be noted, however, that such predetermined level assumes that the output from circuit 10 is relatively linear throughout the integration timing range. It may be desirable to vary the reference signal level from the predetermined signal level according to the particular characteristics expected in the output of the circuit 10. For example, if it is anticipated that the actual output from the circuit 10 at the end of integration would be greater than the output had the circuit 10 output been linear, then the reference signal level may be set such that it is not greater than the predetermined signal level. Such would help prevent inadvertent overranging of the ADC 14 which may result from, for example, noise in the analog input signal or variations in the components forming the comparator 12 and the reference source 13. As an example, although the predetermined signal level in the embodiment described above is 5 volts, an alternative embodiment would set the reference signal level to about 4.7 volts. Such a variation from the predetermined signal level will not affect the scaling factor to be applied to the output of the integrate and hold circuit 10 because the factor is determined by the ratio of the calibration range to the integration timing range.

Turning now to FIG. 3 and a detailed description of a specific embodiment of the prescaling device of FIG. 1 in accordance with the present invention, the analog input signal is applied to a preamplifier 40 of conventional design and wired in a conventional feedback fashion. The output of the preamplifier 40 is applied through a resistor 42 to the integrate and hold circuit 10. The circuit 10 generally includes solid-state switches 44, 46, 48 and 50, an operational amplifier 54, an integrating capacitor 60, a driver 64, a unity gain inverting amplifier 68 and the associated components. The switches 44, 46, 48 and 50 have their switched terminals connected in series. In the embodiment disclosed herein the switches 44–50 are field effect transistor (FET) devices well known in the art. Preferably, the switches 44 and 46 are formed on a single integrated circuit substrate, the purpose of which will subsequently be described. The switches 44–50 may be a type designation IH401A as described in the Intersil Data Book copyright July, 1979 at pages 3-130 to 3-134. The resistor 42 is also connected to the anode of a bypass diode 52, the cathode of which is connected to ground. A resistor 51 is connected between the switches 48 and 50 to ground. The resistor 51 improves the leakage current through the switches 48 and 50.

The junction between the switches 44 and 46 is connected to the inverting input of the operational amplifier 54 which is configured as an integrator. The noninverting terminal of the amplifier 54 is connected to a capacitor 56 and to a resistor 58. The capacitor 56 and the resistor 58 are in turn each connected to ground. The output of the amplifier 54 is connected through the integrating capacitor 60 to the inverting input of the amplifier 54. The output of the amplifier 54 is also connected through a current limiting resistor 62 to one terminal of the switch 50. The switches 44–50 are controlled by means of the driver 64 which may comprise a dual C-MOS driver/voltage translator such as a type designation IH6201 described in the Intersil Data Book copyright July, 1979, at pages 3-147 to 3-150.

The output of the amplifier 54 is also applied through a resistor 66 to the inverting input of the unity gain inverting amplifier 68 connected in a conventional fashion. The output of the amplifier 68 is in turn applied to the analog-to-digital converter 14. The analog-to-digital converter 14 is of conventional design and can be, for example, a type designation ADC-1140 as manufactured by Analog Devices, Inc., and further described in Analog Devices Data Acquisition Data Book copyright 1982 at pages 11-147 to 11-148.

The output of the amplifier 68 is also applied to the inverting terminal of a comparator 70 corresponding to the comparator 12 of FIG. 1. A voltage divider comprising resistors 72 and 74 connected in series between +V and ground corresponds to the reference source 13 and generates a reference signal at the node between the resistors 72 and 74. The reference signal is applied to the non-inverting input of the comparator 70.

The output of the comparator 70 is applied to the control logic 16 comprising NAND gates 76 and 80, D-type flip-flops 78 and 82 and the associated components. The output of the comparator 70 is connected to one input of a two-input NAND gate 76, the output of which is connected to the D input of the conventional D-type flip-flop 78. The $\overline{Q}$ output of the flip-flop 78 is connected to one input of the two-input NAND gate 80. The second conventional D-type flip-flop 82 provides a Q output thereof to the second input of the gate 80. The flip-flop 82 $\overline{Q}$ output is connected through an inverter 83 and a delaying circuit comprising a capacitor 84 and a resistor 86 to the I2 input of the driver 64.

In the embodiment of FIG. 3, a microprocessor system 88 along with an interface 92 responds to and generates the various signals that were described above with reference to FIG. 1 as being applied to or originating from the external circuitry 24. The system 88 is of conventional design and may include, for example, a type designation 8085 microprocessor manufactured by Intel and the related memory, interface and control elements. Such microprocessor and applications thereof are discussed in the Intel Component Data Catalog, dated January 1982, copyright 1981, at pages 7-10 to 7-25.

The microprocessor system 88 communicates with the interface 92 via a plurality of address 90a, data 90b, control 90c and clock 90d lines. The interface 92 is of conventional design and may include, for example, an address decoder 92a responsive to the address lines 90a to decode predetermined addresses accessible by the microprocessor system 88. The address decoder 92a in turn controls data latches 92b and 92c which latch data appearing on the data lines 90b, providing outputs to be described below. Three-state drivers 92d respond to various signals described subsequently and to the address decoder 92a to provide data signals to the microprocessor system 88. An interrupt request flip-flop 92e may be clocked by a signal applied thereto to generate an interrupt signal via line 90c that is applied to the microprocessor system 88. The system 88 may reset the interrupt request flip-flop by means of a signal from the data latch 92c in a conventional fashion. In the embodiment disclosed herein, the various control signals described below may correspond to predetermined bits within the data word appearing on the data lines 90b from the microprocessor system 88. By controlling the state of such bits and addressing a predetermined address which is decoded by the address decoder 92a, one of the data latches 92b or 92c latches the data to thus generate the control signals, which may be a logic zero or one according to the state of the data word bit. Such interface techniques are common and well known to those skilled in the art. As used herein, "logic one" refers to a high-level signal and "logic zero" refers to a low-level signal.

A plurality of data signals from the data lines 90b are applied to a programmable timer 96. The timer 96 along with the microprocessor system 88 and the interface perform the functions attributed to the timer and range counter 22. The programmable timer generates pre-programmed time periods according to the data appearing on the data lines 94. The interface 92 also provides a clock signal from the clock line 90d to the timer 96 via a line 98. In the embodiment of FIG. 3, the clock is derived from the microprocessor system 88 clock and can be, for example, 1.8432 MHz. The interface 92 further provides a write signal to the programmable timer 96 via a line 100 from the address decoder 92a which loads the data on the lines 94 into the timer 96. The timer counts the clock pulses applied thereto to thereby determine the time period specified by the data loaded into the timer 96. More specifically, the data loaded into the timer 96 determines the number of clock pulses to be counted by the timer 96 until a timer output pulse is generated. By varying the data loaded into the timer 96, the number of clock pulses counted and thus the time periods between output pulses can be varied. In the present embodiment the timer 96 may be a type designation 8253-5 manufactured by Intel and described in the Intel Component Data Catalog dated January 1982 copyright 1981, at pages 9-307 to 9-317. However, the timer 96 can be implemented by other suitable means such as programmable up-down counters as will be apparent to those skilled in the art.

The output of the programmable timer 96 is connected to the clock inputs of the flip-flops 78 and 82 and also provides an interrupt signal via a line 97 to the interface 92. The line 97 is applied to the interrupt request flip-flop 92e which generates an interrupt request signal that is applied to the microprocessor system 88.

The microprocessor system 88, by means of the address decoder 92a and the data latches 92b and 92c, provides several control signals to the remaining circuitry. The signals include two reset signals carried via lines 101 and 102 to the flip-flops 82 and 78. Such reset signals are identified herein as reset 1 and reset 2 corresponding to the lines 101 and 102, respectively. A last period (LP) signal is connected via a line 104 to the second input of the gate 76. Lastly, a convert command signal is connected via a line 106 to the analog-to-digital converter 20.

The digital output from the converter 14, a conversion complete signal from the converter 14, and an integrate/hold status signal from the $\overline{Q}$ output of the flip-flop 78 are connected through lines 108, 110 and 112 to the three state drivers 92d. The microprocessor system 88 may generate the appropriate addresses which, when decoded, control some or all of such signals to be applied through the drivers 92d to the data lines 90b for use by the microprocessor system 88.

Turning now to a description of the operation of FIG. 3, such operation begins with the reset or clear period C as shown in FIG. 2. To provide such timing interval, the microprocessor system 88, through the interface 92, loads data into the timer 96 to program the timer for the interval C. The timer 96 then begins to count clock pulses on the line 98. During such reset interval, the microprocessor system 88 through the data latch 92b causes low-level active reset signals, reset 1 and reset 2, to be applied via the lines 101 and 102 to flip-flops 78 and 82, thereby resetting such flip-flops. A resulting logic zero signal from the output of inverter 83 is applied through the resistor 86 to the I2 terminal of the driver 64. The driver 64 translates the signal levels produced at the output of inverter 83 into levels suitable for use by the FET switches 48 and 50. In the present embodiment, the output from the inverter 83 is a standard transistor-transistor logic (TTL) signal (i.e., 0 to +5 volts) while the switches 48 and 50 require bipolar voltages (+15 v and −15 v) for operation. The driver 64 translates a logic one TTL (+5 v) signal from inverter 83 into logic one bipolar (+15 v) and logic zero bipolar (−15 v) signals at the $\phi 2$ and $\overline{\phi 2}$ outputs, respectively. Conversely, a logic zero TTL (0v) from inverter 83 produces logic zero bipolar (−15 v) and logic one bipolar (+15 v) signals from the $\phi 2$ and $\overline{\phi 2}$ outputs, respectively. The TTL output from gate 80 controls the $\phi 1$ and $\overline{\phi 1}$ outputs in a similar fashion. Although the embodiment disclosed herein employs the driver 64, other suitable driving circuits will be apparent to those skilled in the art.

Continuing now with the description of the logic 0 from inverter 83 applied to the I2 input of driver 64, such input causes the $\overline{\phi 2}$ output of driver 64 to be a logic 1, thereby closing the switches 48 and 50. Moreover, the logic zero output from flip-flop 82 is applied to the gate 80, generating a logic 1 output therefrom which is applied to the driver 64, thereby controlling the $\overline{\phi 1}$ output thereof to close the switch 46. In this configuration, the integrating capacitor 60 is short-circuited through the resistor 62 to thereby discharge or reset the capacitor 60. Also, a logic zero output from the $\phi 1$ output of the driver 64 opens the switch 44 to disconnect the preamplifier 40 from the integrate and hold circuit 10.

While the timer 96 continues to time through the reset or clear period C of FIG. 2, the microprocessor system 88 latches data into data latch 92b which inactivates the reset signals, that is, applies logic one signals via the lines 101 and 102 to the flip-flops 78 and 82. Also, the microprocessor system 88 latches into data latch 92b a logic one bit to thereby generate a logic one last range signal on the line 104. Moreover, the microprocessor system 88 writes into the timer 96 the data necessary to generate the next timing period, that is, timing period T1. The timer 96 is able to store the data necessary to define a next timing period while simultaneously counting clock pulses for a present timing period.

With the integrating capacitor 60 reset, the output of the amplifier 54 as inverted by the inverting stage 68 is less than the predetermined limit defined by the resistors 72 and 74. Thus, the output of the comparator 70 is high or a logic one. Such logic one along with the logic one last range signal on line 104 produces a logic zero at the output of the gate 76 which is in turn applied to the flip-flop 78. At the end of the reset or clear period C, the timer 96 generates a pulse which is applied to the flip-flops 78 and 82. The timer 96 then begins to count clock pulses applied thereto via the line 98 for the first timing period T1. Because a logic zero is applied to the D input of flip-flop 78, the receipt of the clock pulse from the timer 96 does not change the state of the flip-flop 78, and a logic one from the $\overline{Q}$ output thereof remains applied to the gate 80. However, the output of the flip-flop 82 is toggled by the clock pulse from the timer 96, and thus the Q output thereof generates a logic one that is inverted by the gate 80 and applied through the driver 64 to open the switch 46 and close the switch 44. The logic one from inverter 83 is delayed slightly by the capacitor 84 and the resistor 86. Consequently, the switches 48 and 50 which are controlled by such delayed logic one from inverter 83 via the driver 64 are opened a short time after the switch 46 is opened and the switch 44 is closed. The delay in the embodiment of FIG. 3 can be, for example, several hundred nanoseconds, the purpose of which is to be described.

With switch 44 closed and switch 46 open, the amplifier 54 and the capacitor 60 begin the integration of the analog input signal as amplified by the preamplifier 40. In the embodiment disclosed herein, the analog input signal is a current in a range of approximately −1 picoampere to −1 microampere. The preamplifier 40 converts the input current into a voltage in the range of 10 microvolts to 10 volts.

It is seen that the switches 44 and 46 are switched in a reciprocal fashion, that is, that switch 44 is open when switch 46 is closed, and vice versa. Such a novel switching arrangement substantially reduces or cancels charge injection from the switches 44 and 46 which would otherwise be present at the inverting input of the amplifier 54. Such charge injection can otherwise be a source of error particularly where low voltages are being integrated. Such charge injection cancellation is enhanced by selecting the switches 44 and 46 to be sections of the same integrated circuit or package. Because the switches 44 and 46 are formed in the same integrated circuit and on the same substrate, thermal effects and influences of the semiconductor materials forming the switches 44 and 46 are relatively similar, thereby producing relatively equal charge injection characteristics.

Moreover, it is to be noted that the switches 48 and 50 are opened slightly after the switch 46 is opened. With switch 46 open, charge injection originating with switches 48 and 50 cannot reach the summing node at the inverting terminal of the amplifier 54, further reducing the effects of charge injection.

Assume now that the output of the integrator and the inverting amplifier 68 is as shown by line 34a of FIG. 2. The timing signal pulse from the timer 96 which began timing period T1 is applied to the interrupt request flip-flop 92e which in turn applies an interrupt request to the microprocessor system 88. In response thereto, the microprocessor system 88 performs an interrupt service routine which may, among other tasks, increment a range counter, load into the timer 96 the data necessary for the next timing period according to the value of the range counter, and reset the interrupt request flip-flop 92e. The range counter may simply be a memory location within the microprocessor system 88 which is reset during the clear period C and which is incremented to count the number of timing periods completed. Such a technique is well known in the microcomputer art. In servicing the interrupt generated at the beginning of timing period T1, the timer 96 is loaded with data to program the time 96 for the next timing period, T2.

At the end of the first timing period T1 which in the present embodiment may have a period of about 1600 microseconds, the timer 96 generates an output pulse and then begins counting for the timing period T2. The microprocessor 88, in response to the timing pulse from the timer 96, services the interrupt created thereby and loads into the timer 96 the data necessary for the next timing period T3. It is to be noted that the timing periods T1 and T2 are of equal length. However, the timing period T3 is twice the length of the timing period T2. Data to establish such timing periods may be stored in the microprocessor system 88 memory. The correct data may be selected according to the status of the range counter using programming techniques well known in the art.

Because the output of the inverting amplifier 68 is below the predetermined limit 30 set by the resistors 72 and 74, the output of the gate 76 remains low. Thus flip-flop 78 does not change state upon receipt of the timing signal pulse from the timer 96 at the end of the timing periods T1 and T2.

The microprocessor system 88 continues to control the programmable timer 96 as just described to generate time periods T3–T6 and thus ranges R3–R6. During timing period T6, the microprocessor system 88 loads into the timer 96 data necessary to generate the last timing period T7. At the end of the timing period T6 and range R6, the timing signal pulse from the timer 96 is again applied as an interrupt to the microprocessor system 88. In response thereto, the microprocessor system 88 determines from the range counter within the system 88 that timing period T6 is completed and that period T7 is currently being timed. Consequently, the microprocessor system 88 through the data latch 92b applies a logic zero last range signal via the line 104 to the gate 76 which in turn generates a logic 1 that is applied to the flip-flop 78. At the end of timing period T7 and range R7, the programmable timer 96 generates a timing signal pulse which clocks the flip-flop 78, changing the $\overline{Q}$ output thereof to a logic zero and thus forcing the output of the gate 80 to a logic 1. In response thereto, the driver 64 controls the switches 44 and 46 such as to open the switch 44 and close the switch 46. As described previously, the reciprocal states of the switches 44 and 46 help to reduce the influences of charge injection upon the summing node at the inverting terminal of the amplifier 54. Moreover, with switch 44 open, integration ceases and the output of the amplifier 54 is held at the integrated signal level existing at the time the switches 44 and 46 changed states. Thus, the output of the inverting stage 68 is shown by line 34b of FIG. 2.

In response to each timing signal pulse generated by the timer 96, the microprocessor system 88 also interrogates the status of the integrate/hold line 112 through the three-state drivers 92d. Before the end of timing period T7, the integrate/hold line 112 was a logic 1. However, once flip-flop 78 is clocked at the end of timing period T7 as just described, the integrate/hold line 112 is a logic zero. With such a logic zero now applied thereto, the microprocessor system 88 may command the converter 14 via the data latch 92c and line 106 to convert the analog signal applied thereto into the digital output applied to the lines 108. Once the conversion is complete, the converter 14 generates a signal on the line 110 which is applied through the three-state drivers 92d to the microprocessor system 88. In response to such a signal, the microprocessor system 88 reads the digital output from the converter 14.

Throughout the integration process, the range counter implemented by the microprocessor system 88 has counted the number of timing periods through which the integration process has passed, in this case, periods T1–T7. Consequently, the integration timing range is R7. Because R7 requires no multiplier or scaling factor to be applied to the converter digital output, the microprocessor system 88 uses the digital output from the converter 14 without applying any such multiplier or scaling factor thereto. Thus, the digital output of the converter 14 directly represents the magnitude of the signal from the amplifier 54 and the inverter 68.

During the time that the analog-to-digital conversion is being performed by the converter 14, the timer 96 may be disabled by the microprocessor system 88 or may be controlled to count through one or more idle time periods. Once the converter 14 has completed the analog-to-digital conversion and the microprocessor system 88 has read the resulting digital output, the microprocessor system 88 loads data into the timer 96 for the reset or clear time period C of FIG. 2 which begins the prescaling and analog-to-digital conversion cycle as just described.

Assume, however, that the analog input signal now produces an output from the inverting amplifier 68 as is shown by the line 36a of FIG. 2. In such an instance, the output of the comparator 70 becomes a logic zero during the timing period T6, that is, after the end of range R5 but before the end of range R6. When the timing signal pulse from the timer 96 is generated at the end of the timing period T6 and range R6, the flip-flop 78 is toggled to change the circuit 10 from integrate to hold as previously described. Also, the integrate/hold signal on the line 112 indicates to the microprocessor system 88 that the integration has terminated. At such time, the microprocessor system 88 can then command the converter 14 to perform the analog-to-digital conversion as previously described. It will be noted that the range counter implemented by the microprocessor system 88 has counted the number of timing periods required for integration. For the present example, integration terminated at the end of range R6. Consequently, the digital output from the converter 14 is multiplied or scaled by the microprocessor system 88 by a factor of two. Again, once the conversion process performed by the converter 14 is completed, the circuitry is reset and integration is begun as previously described. It is seen that the prescaling device and method of the present invention does not require a complete conversion cycle to verify that the prescaling range is correct. Instead, prescaling is performed for only enough timing periods to adequately prescale the input signal with the resulting prescaling factor or multiplier readily ascertainable at the end of the proper prescaling integration timing range.

The embodiment of FIG. 3 also advantageously allows the microprocessor system 88 to select a timing range through which the circuitry will operate regardless of the output of the amplifier 54 and the inverting amplifier 68. Consequently, integration continues until the selected timing range is completed. Such a forced range operating mode may be useful, for example, where it is desired to collect and average the results from several integrations and then scale the result thereof. Also, the forced range operating mode can avoid overranging problems where the analog input signal is noisy by forcing the prescaling device to operate throughout a predetermined integrating timing range previously determined to be acceptable for the particular analog input signal.

In such a forced range operating mode, the circuitry is reset as previously described. Assume as an example that the sixth range R6 is selected as the forced integration timing range. During the reset time interval C, both range signals on the lines 101 and 102 are active, that is, a logic zero. However, before the end of the reset time interval C, only the reset 1 signal on the line 101 is controlled by the microprocessor system 88 to be inactive, that is, a logic one.

Thus, at the beginning of the first timing period T1, the timing signal pulse from the timer 96 clocks the flip-flop 82 such that the resulting logic one outputs of inverter 83 and of flip-flop 82 Q output the driver 64 to close the switch 44 and open the switches 46, 48 and 50. The active reset 2 signal on the line 102 inhibits operation of the flip-flop 78 during the timing periods T1–T5. However, during timing period T6, that is, the timing period at the end of which integration is to terminate to thereby force range R6 to be the integration timing range, the reset 2 signal on the line 102 is controlled by the microprocessor to become inactive, that is, a logic one. Also, the microprocessor system 88 provides a logic zero last range signal on the line 104 during the timing period T6. Thus, at the end of the timing period T6 and the range R6, the timing signal pulse from the timer 96 causes the flip-flop 78 to change state, thereby indicating to the microprocessor system 88 via the integrate/hold line 112 that the integration cycle is complete. Morever, it is seen that, because flip-flop 78 is inhibited by the reset signal applied thereto during the time periods T1–T5, the outputs of the amplifier 54, the inverter 68 and the comparator 70 are irrelevant.

Thus, integration is forced to continue into and through timing period T6, thereby forcing range R6 to be completed. The converter 14 can then be commanded as previously described to provide the digital output. The range counter implemented by the microprocessor system 88 counts the timing periods as previously described and, as a consequence, multiplies or scales the output of the digital converter 14 accordingly. In the example just described, the converter digital output on the lines 108 would be scaled by a factor of two to provide the final correctly prescaled digital representation.

It is to be recognized that the functions performed by the microprocessor system 88 can be implemented in other suitable ways such as by fixed logic circuitry and that such a modification would be obvious to one of ordinary skill in the art. Also, such a system need not include the forced range feature described herein, thereby consequently simplifying the control logic represented by the flip-flops 78 and 82 and the associated gating. Moreover, a prescaling device in accordance with the present invention need not necessarily be used with an analog-to-digital converter but instead may be useful in any application requiring the prescaling of an analog signal.

Having thus described a preferred embodiment in accordance with the present invention, it is to be recognized that numerous alternatives and equivalents will be obvious to those of ordinary skill in the art and that the invention is to be afforded the full scope of the appended claims.

What is claimed is:

1. A prescaling device for integrating an input signal and for generating an integrator output signal scaled with respect to the input signal, comprising:
    timer means for generating a timing signal at the end of each of a plurality of timing periods;
    integrator means responsive to the input signal for integrating the input signal to generate an integrator output signal proportional thereto, the integrator means including means for holding the integrator output signal in response to a hold signal;
    reference means for generating a reference signal;
    comparator means responsive to the integrator output signal and the reference signal for generating a signal when the integrator output signal is in a predetermined relationship with the reference signal;
    gating means for generating the hold signal in response to the comparator means signal and the timing signal whereby integration is halted at the end of one of the plurality of timing periods; and
    first counting means responsive to the timing signals for counting the number of timing periods before the integrator output signal was held to establish an integration timing range, such integration timing range providing an indication of a scaling factor to be applied to the integrator output signal.

2. A device as in claim 1 wherein the device further includes second counting means for counting the timing signals and for generating the hold signal after a predetermined number of timing periods.

3. A device as in claim 1 wherein the timer means further includes means for generating the timing signals such that each timing signal defines a timing range having a duration equal to the sum of the one or more timing periods which comprise the timing range and means for establishing the duration of each of the plurality of timing periods such that each timing range after a first timing range is twice as long as an immediately preceding timing range.

4. A device as in claim 1 wherein each timing signal defines a timing range having a duration equal to the sum of the previous timing periods which comprise the timing range and wherein the timer means includes means for establishing the duration of the plurality of timing periods such that the length of a timing range after a first timing range has a predetermined relationship with respect to the length of an immediately preceding timing range.

5. A prescaling device for integrating an input signal and for generating an integrator output signal scaled with respect to the input signal, comprising:
    integrator means responsive to the input signal for integrating the input signal to generate an integrator output signal proportional thereto, the integrator means including means for holding the integrator output signal in response to a hold signal;
    reference means for generating a reference signal;
    comparator means responsive to the integrator output signal and the reference signal for generating a signal when the integrator output signal is in a predetermined relationship with the reference signal;
    timer means for generating a timing signal at the end of each of a plurality of timing periods and timing ranges such that each timing range has a duration equal to the sum of the timing periods which comprise the timing range, the timer means including means for fixing the durations of the timing periods such that the duration of each timing range after a first timing range with respect to the duration of an immediately preceding timing range defines a predetermined ratio;
    gating means for generating the hold signal in response to the comparator means signal and the timing signal whereby integration can be halted at the end of one of the plurality of timing periods;
    first counting means responsive to the timing signals for counting the number of timing periods before the integrator output signal was held to establish an integration timing range, such integration timing range providing an indication of a scaling factor to be applied to the integrator output signal; and
    second counting means for counting the timing signals and for generating the hold signal after a predetermined number of timing periods.

6. A device as in claim 5 wherein the gating means includes means for inhibiting the hold signal in response to an inhibit signal and the device further includes means for generating the inhibit signal until the predetermined number of timing periods have been generated.

7. A device as in claim 5 wherein the reference means includes means for generating the reference signal not greater than a predetermined signal level, the predetermined signal level defining a second predetermined ratio of a first signal range between first and second integrator output signal levels to a second signal range between the first integrator output signal level and the predetermined signal level, the second ratio being equal to the first predetermined ratio.

8. A device as in claim 7 wherein the first and second ratios are substantially equal to two.

9. A system for converting an analog input signal into a scaled digital output comprising:
    integrator means responsive to the input signal for integrating the input signal to generate an integrator output signal proportional thereto, the integrator output signal varying within a first predetermined signal range between first and second signal levels, the integrator means further including means for holding the integrator output signal in response to a hold signal;
    reference means for generating a reference signal at a signal level not greater than a predetermined signal level, the predetermined signal level defining a second predetermined signal range between the integrator output signal first signal level and the predetermined signal level to thereby fix the reference signal level with respect to the first predetermined signal range;
    comparator means responsive to the integrator output signal and the reference signal for generating a signal when the integrator output signal is in a predetermined relationship with the reference signal;

timer means for generating timing signals which define a plurality of timing periods and timing ranges such that each timing range has a duration equal to the sum of the timing periods which comprise the timing range, the timer means including means for establishing the duration of the plurality of timing periods such that a ratio of the length of a timing range after a first timing range to the length of an immediately preceding timing range is substantially equal to the ratio of the first predetermined signal range to the second predetermined signal range;

gating means for generating the hold signal in response to concurrent reception of the comparator means signal and the timing signal whereby integration can be halted at the end of one of the plurality of timing periods;

first counting means responsive to the timing signals for counting the number of timing periods before the integrator output signal was held for indicating the length of an integration timing range during which integration occurs;

means responsive to the hold signal for generating a conversion command signal in response thereto;

analog-to-digital converter means responsive to the integrator output signal and to the conversion command signal for converting the integrator output signal into a digital output; and processor means for determining a scaling factor equal to the ratio of the length of a calibration timing range to the length of the integration timing range and for multiplying the digital output by the scaling factor to thereby provide the scaled digital output.

10. A system as in claim 9 wherein the system further includes second counting means for counting the timing signals and for generating the hold signal after a predetermined number of timing periods.

11. A prescaling method for integrating an input signal and for generating an integrated output signal scaled with respect to the input signal, comprising the steps of:

generating a timing signal at the end of each of a plurality of timing periods;

integrating the input signal to generate an integrated output signal proportional thereto;

generating a reference signal;

comparing the integrated output signal and the reference signal and generating a comparison signal when the integrated output signal is in a predetermined relationship with the reference signal;

holding the integrated output signal in respose to the comparison signal and the timing signal whereby integration is halted at the end of one of the plurality of timing periods; and counting the number of timing periods before the integrator output signal was held to establish an integration timing range, such integration timing range providing an indication of a scaling factor to be applied to the integrated output signal.

12. A method as in claim 11 wherein the step of holding the integrated output includes the alternate step of counting the timing signals and holding the integrated output signal after a predetermined number of timing periods.

13. A method as in claim 11 wherein the step of generating the timing signal includes generating the timing signals such that each timing signal defines a timing range having a duration equal to the sum of the one or more timing periods which comprise the timing range and further includes establishing the duration of each of the plurality of timing periods such that each timing range after a first timing range is twice as long as an immediately preceding timing range.

14. A method as in claim 11 wherein the step of generating the timing signals includes generating the timing signals such that each timing signal defines a timing range having a duration equal to the sum of the timing periods which comprise the timing range and further includes establishing the duration of the plurality of timing periods such that the length of a timing range after a first timing range has a predetermined relationship with respect to the length of an immediately preceding timing range.

15. A prescaling method for integrating an input signal and for generating an integrated output signal scaled with respect to the input signal, comprising:

integrating the input signal to generate an integrated output signal proportional thereto;

generating a reference signal;

comparing the integrated output signal and the reference signal and generating a comparison signal when the integrator output signal is in a predetermined relationship with the reference signal;

generating timing signals which define a plurality of timing periods and timing ranges such that each timing range has a duration equal to the sum of the timing periods which comprise the timing range;

fixing the durations of the timing periods such that the duration of each timing range after a first timing range with respect to the duration of an immediately preceding timing range defines a predetermined ratio;

holding the integrated output signal in response to the comparison signal and the timing signal whereby integration is halted at the end of one of the plurality of timing periods, or counting the timing signals and holding the integrated output signal after a predetermined number of timing periods whereby integration is halted at a predetermined number of timing periods; and counting the number of timing periods before the integrator output signal was held to establish an integration timing range, such integration timing range providing an indication of a scaling factor to be applied to the integrated output signal.

16. A method as in claim 15 wherein the step of generating the reference signal further includes generating the reference signal not greater than a predetermined signal level, the predetermined signal level defining a second predetermined ratio of a first signal range between first and second integrator output signal levels to a second signal range between the first integrator output signal level and the predetermined signal level, the second ratio being equal to the first named predetermined ratio.

17. A method as in claim 16 further including fixing the first and second predetermined ratios substantially equal to two.

18. A method as in claim 15 wherein the step of holding the integrated output signal further includes inhibiting the holding of the integrated output signal until a predetermined number of timing periods have been generated.

19. A method for converting an analog input signal into a scaled digital output comprising the steps of:

integrating the input signal to generate an integrated output signal proportional therto, the integrated output signal varying within a first predetermined signal range between first and second signal levels;

generating a reference signal at a signal level not greater than a predetermined signal level, the predetermined signal level defining a second predetermined signal range between the integrated output signal first signal level and the predetermined signal level;

comparing the integrated output signal and the reference signal and generating a comparison signal when the integrated output signal is in a predetermined relationshp with the reference signal;

generating timing signals which define a plurality of timing periods and timing ranges such that each timing range has a duration equal to the sum of the timing periods which comprise the timing range;

establishing the duration of the plurality of timing periods such that a ratio of the length of a timing range after a first timing range to the length of an immediately preceding timing range is substantially equal to the ratio of the first predetermined signal range to the second predetermined signal range;

holding the integrated output signal in response to the comparison signal and the timing signal whereby integration is halted at the end of one of the plurality of timing periods;

counting the number of timing periods before the integrator output signal was held to establish an integration timing range;

converting the integrated output signal into a digital output at the end of the integration timing range;

determining a scaling factor equal to the ratio of the length of a calibration timing range to the length of the integration timing range; and multiplying the digital output by the scaling factor to thereby provide the scaled digital output.

20. A method as in claim 19 wherein the method includes the additional step of counting the timing signal and holding the integrated output after a predetermined number of timing periods whereby integration can be halted at a maximum timing range after the predetermined number of timing periods.

21. A switching device for an integrator wherein the integrator includes an input terminal, an output terminal, and an integrating element connected between the input and output terminals, the switching device comprising:

a first solid-state switch having a first switched terminal connected to the integrator input terminal, a second switched terminal adapted to receive an input signal, and a control terminal adapted to receive a first control signal for controlling conduction between the first and second switched terminals;

a second solid-state switch having a first switched terminal connected to the integrator input terminal, a second switched terminal and a control terminal adapted to receive a second control signal for controlling conduction between the first and second switched terminals;

a third solid-state switch having a first switched terminal connected to the integrator output terminal, a second switched terminal connected to the second switched terminal of the second solid-state switch, and a control terminal adapted to receive a control signal for controlling conduction between the first and second switched terminals; and a switching controller responsive to integrate, hold and reset signals and including means for generating the first, second and third control signals such that the first solid-state switch conducts and the second solid-state switch does not conduct in response to the integrate signal, the first and third solid-state switches do not conduct and the second solid-state switch does conduct in response to the hold signal, and the first solid-state switch does not conduct while the second and third solid-state switches conduct in response to the reset signal, the first and second solid-state switches being operated in a reciprocal fashion to reduce the influence of change injection from such switches into the integrator input terminal.

22. A switching device as in claim 21 wherein the first and second solid-state switches are formed on a single substrate.

23. A switching device as in claim 22 wherein the switching controller includes means for opening the third solid-state switch after the second solid-state switch is opened to further reduce charge injection by the third solid-state switch into the integrator input terminal.

24. A switching device for an integrator wherein the integrator includes an input terminal, an output terminal, and an integrating element connected between the input and output terminals, the switching device comprising:

first, second and third solid-state switches formed on a single substrate;

the first solid-state switch having a first switched terminal connected to the integrator input terminal, a second switched terminal adapted to receive an input signal, and a control terminal adapted to receive a first control signal for controlling conduction between the first and second switched terminals;

the second solid-state switch having a first switched terminal connected to the integrator input terminal, a second switched terminal and a control terminal adapted to receive a second control signal for controlling conduction between the first and second switched terminals;

the third solid-state switch having a first switched terminal connected to the integrator output terminal, a second switched terminal connected to the second switched terminal of the second solid-state switch, and a control terminal adapted to receive a control signal for controlling conduction between the first and second switched terminals; and a switching controller responsive to integrate, hold and reset signals and including means for generating the first, second and third control signals such that the first solid-state switch conducts and the second solid-state switch does not conduct in response to the integrate signal, the first and third solid-state switches do not conduct and the second solid-state switch does conduct in response to the hold signal, and the first solid-state switch does not conduct while the second and third solid-state switches conduct in response to the reset signal, the switching controller including means for opening the third solid-state switch after the second solid-state switch is opened, the first and second solid-state switches being operated in a reciprocal fashion to reduce the influence of charge injection from such switches into the integrator input terminal.

25. A method for controlling a switching device for an integrator wherein the integrator includes an input terminal, an output terminal, and an integrating element connected between the input and output terminals, wherein the switching device includes:

a first solid-state switch having a first switched terminal connected to the integrator input terminal, a second switched terminal adapted to receive an input signal, and a control terminal adapted to receive a first control signal for controlling conduction between the first and second switched terminals;

a second solid-state switch having a first switched terminal connected to the integrator input terminal, a second switched terminal and a control terminal adapted to receive a second control signal for controlling conduction between the first and second switched terminals;

a third solid-state switch having a first switched terminal connected to the integrator output terminal, a second switched terminal connected to the second switched terminal of the second solid-state switch, and a control terminal adapted to receive a control signal for controlling conduction between the first and second switched terminals; and a switching controller responsive to integrate, hold and reset signals and including means for generating the first, second and third control signals, the method including the steps of:

generating the first, second and third control signals such that the first solid-state switch conducts and the second solid-state switch does not conduct in response to the integrate signal;

generating the first, second and third control signals such that the first and third solid-state switches do not conduct and the second solid-state switch does conduct in response to the hold signal; and generating the first, second and third control signals such that the first solid-state switch does not conduct while the second and third solid-state switches conduct in response to the reset signal, the first and second solid-state switches being operated in a reciprocal fashion to reduce the influence of change injection from such switches into the integrator input terminal.

* * * * *